United States Patent
Wu et al.

(10) Patent No.: US 6,913,980 B2
(45) Date of Patent: Jul. 5, 2005

(54) PROCESS METHOD OF SOURCE DRAIN SPACER ENGINEERING TO IMPROVE TRANSISTOR CAPACITANCE

(75) Inventors: Zhiqiang Wu, Plano, TX (US); Jihong Chen, Plano, TX (US); Kaiping Liu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/609,823

(22) Filed: Jun. 30, 2003

(65) Prior Publication Data

US 2004/0266121 A1 Dec. 30, 2004

(51) Int. Cl.⁷ ............................................. H01L 21/336
(52) U.S. Cl. .................. 438/301; 438/302; 438/303; 438/305; 438/307
(58) Field of Search ................................. 438/301, 302, 438/303, 305, 307

(56) References Cited

U.S. PATENT DOCUMENTS

| | | | | | |
|---|---|---|---|---|---|
| 5,920,774 | A | * | 7/1999 | Wu | 438/224 |
| 6,200,840 | B1 | * | 3/2001 | Chen et al. | 438/184 |
| 6,274,446 | B1 | | 8/2001 | Agnello et al. | |
| 6,274,894 | B1 | | 8/2001 | Wieczorek et al. | |
| 6,407,436 | B1 | | 6/2002 | Agnello et al. | |
| 6,479,359 | B2 | * | 11/2002 | Kim | 438/304 |
| 6,506,650 | B1 | * | 1/2003 | Yu | 438/301 |
| 6,506,653 | B1 | * | 1/2003 | Furukawa et al. | 438/305 |
| 6,518,136 | B2 | * | 2/2003 | Lee et al. | 438/303 |
| 6,552,394 | B2 | * | 4/2003 | Ahmad et al. | 257/344 |
| 6,566,183 | B1 | * | 5/2003 | Chen et al. | 438/230 |
| 6,660,605 | B1 | * | 12/2003 | Liu | 438/307 |
| 6,743,684 | B2 | * | 6/2004 | Liu | 438/300 |
| 6,828,203 | B2 | * | 12/2004 | Inaba | 438/305 |
| 2002/0072182 | A1 | * | 6/2002 | Ha et al. | 438/301 |
| 2002/0127763 | A1 | * | 9/2002 | Arafa et al. | 438/76 |
| 2002/0151145 | A1 | * | 10/2002 | Lee et al. | 438/303 |
| 2003/0032228 | A1 | | 2/2003 | Honeycutt | |
| 2003/0038308 | A1 | * | 2/2003 | Kim | 257/288 |
| 2003/0127694 | A1 | * | 7/2003 | Morton et al. | 257/371 |
| 2004/0072395 | A1 | * | 4/2004 | Liu | 438/197 |
| 2004/0110351 | A1 | * | 6/2004 | Narasimha | 438/302 |
| 2004/0124450 | A1 | * | 7/2004 | Yeap et al. | 257/288 |
| 2004/0166611 | A1 | * | 8/2004 | Liu | 438/142 |
| 2005/0009256 | A1 | * | 1/2005 | Inaba | 438/197 |

* cited by examiner

*Primary Examiner*—W. David Coleman
*Assistant Examiner*—Khiem D. Nguyen
(74) *Attorney, Agent, or Firm*—Yingsheng Tung; Wade James Brady, III; Frederick J. Telecky, Jr.

(57) ABSTRACT

A method of forming an associated transistor is presented whereby short channel effects and junction capacitances are mitigated and enhanced switching speeds are thereby facilitated. Compensation regions are formed within a substrate by implanting dopants relatively deeply over source and drain regions formed within the substrate. The compensation regions are spaced apart slightly less than are the source and drain regions. This spacing affects potential contours and reduces junction capacitances within the transistor. The different distances between the source and drain regions and the compensation regions are achieved by forming and selectively adjusting sidewall spacers adjacent to a gate structure of the transistor. These spacers serve as guides for the dopants implanted into the substrate to form the source and drain regions and the compensation regions.

32 Claims, 9 Drawing Sheets

PROCESS METHOD OF SOURCE DRAIN SPACER ENGINEERING TO IMPROVE TRANSISTOR CAPACITANCE

FIELD OF INVENTION

The present invention relates generally to semiconductor processing, and more particularly to a methodology for source drain spacer engineering to improve transistor capacitance.

BACKGROUND OF THE INVENTION

Several trends exist presently in the semiconductor and electronics industry. Devices are continually getting smaller, faster and requiring less power. A reason for these trends is that more personal devices are being fabricated which are relatively small and portable, thereby relying on a battery as its primary supply source. For example, cellular phones, personal computing devices, and personal sound systems are devices which are in great demand in the consumer market. In addition to being smaller and more portable, personal devices are requiring more computational power and speed. In light of all these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers, which are generally produced from bulk silicon. In order to accomplish such high densities, smaller feature sizes, smaller separations between features and more precise feature shapes are required in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher effective yield in IC fabrication by providing more circuits on a die and/or more die per semiconductor wafer.

The process of manufacturing integrated circuits typically consists of more than a hundred steps, during which hundreds of copies of an integrated circuit can be formed on a single wafer. This process can create electrically active regions in and on the semiconductor wafer surface. In MOS transistors, for example, a gate structure is created, which can be energized to establish an electric field within a semiconductor channel, by which current is enabled to flow between a source region and a drain region within the transistor. The source and drain regions facilitate this conductance by virtue of containing a majority of positively doped (p) or negatively doped (n) materials.

As device sizes continue to shrink, however, the channel lengths continue to be scaled downward, and short channel effects can become significant. For example, hot carrier effects can be experienced in short channel devices. More particularly, during saturation operation of a MOS transistor, for example, electrons can gain kinetic energy and become "hot". Some of these hot electrons traveling to the drain can be injected into a thin gate dielectric proximate the drain junction. The injected hot carriers, in turn, often lead to undesired degradation of the MOS device operating parameters, such as a shift in threshold voltage, changed transconductance, changed drive current/drain current exchange, device instability, etc.

Similarly, unwanted source/drain leakage conduction or punchthrough current can occur as channel lengths shorten. Punchthrough current may be seen as a parasitic current path existing between the drain and source, which the gate has difficulty in controlling since the current path is located deep in the bulk (substrate) far away from the gate. The actual amount of punchthrough current depends mainly upon the potential distribution under the channel and on the source/drain junction depths. As the effective channel length gets shorter, the source/drain depletion regions get closer together. Punchthrough generally occurs when the effective channel length is decreased to roughly the sum of two junction depletion widths.

In addition, as device densities and operational speeds continue to increase, reduction of the delay times in the MOS devices used in integrated circuits is desired. These delays are related to the on-state resistance as well as the junction capacitances of these MOS devices. Working with smaller and more densely packed devices, however, requires a greater precision in fabrication, which can provide opportunities for errors to occur. For example, dopant may be unintentionally placed in unwanted areas and may increase junction capacitance and cause body leakage, resulting in reduced switching speeds and higher source to drain resistance (Rsd). Imprecisely placed dopants may also migrate into a channel region, for example, and shorten the channel length adding to possible subsurface leakage current paths.

Accordingly, improved techniques for fabricating densely packed semiconductor devices would be desirable. More particularly, it would be desirable to fabricate semiconductor devices in a manner that mitigates short channel effects. Similarly, it would also be desirable to fashion semiconductor devices such that junction capacitances are reduced and switching speeds are thereby enhanced.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to formation of a transistor in a manner that mitigates short channel effects and junction capacitances, thereby facilitating enhanced switching speeds. More particularly, compensation regions are formed with dopants implanted relatively deeply over source and drain regions within a substrate. The compensation regions are spaced apart slightly more than the source and drain regions to alter potential contours and reduce junction capacitances within the transistor. The different distances between the source and drain regions and the compensation regions are achieved by forming and selectively adjusting sidewall spacers adjacent to a gate structure of the transistor. These spacers effectively serve as guides for the dopants implanted into the substrate to form the source and drain regions and the compensation regions.

According to one aspect of the present invention, a method of forming a transistor is disclosed. The method includes forming a first oxide layer over a gate structure. The first oxide layer is also formed over portions of a substrate not covered by the gate structure. These uncovered portions of the substrate also have source/drain extension regions and halo regions formed therein. The method further includes forming a nitride layer over the first oxide layer, forming a second oxide layer over the nitride layer and processing the second oxide layer and nitride layer to form oxide sidewall spacers adjacent the gate structure. In this manner, the oxide sidewall spacers are situated over a residual portion of nitride material. The method further includes processing the oxide sidewall spacers such that they are reduced in size relative to the underlying portions of nitride material. Regions of the substrate adjacent the gate structure are then doped with a first dopant to form source and drain regions within the substrate. The first dopant is, however, substantially blocked by the oxide sidewall spacers and the underlying portions of nitride material. Regions of the substrate adjacent the gate structure are then doped again with a second dopant to form first and second compensation regions within the substrate. The second dopant is, however, substantially blocked by the oxide sidewall spacers.

In accordance with one or more other aspects of the present invention, a method of forming a transistor includes forming source and drain regions within a substrate adjacent to a gate structure formed upon the substrate. The method also includes forming first and second compensation regions within the substrate to a depth about twice that of the source and drain regions. The source and drain regions and the first and second compensation regions are separated by a channel region underlying the gate structure. The source and drain regions are also separated by a first distance and the first and second compensation regions are separated by a second distance, where the first distance is greater than the second distance.

According to one or more other aspects of the present invention, a transistor includes a gate structure formed over a substrate. The transistor also includes a source region formed within the substrate adjacent the gate structure and a drain region formed within the substrate adjacent the gate structure. A first compensation region is formed within the substrate adjacent the gate structure and within the source region. Similarly, a second compensation region is formed within the substrate adjacent the gate structure and within the drain region. The transistor also has a channel underlying the gate structure and separating the source and drain regions and the first and second compensation regions. The source and drain regions are also separated by a first distance and the first and second compensation regions are separated by a second distance, where the first distance is greater than the second distance.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
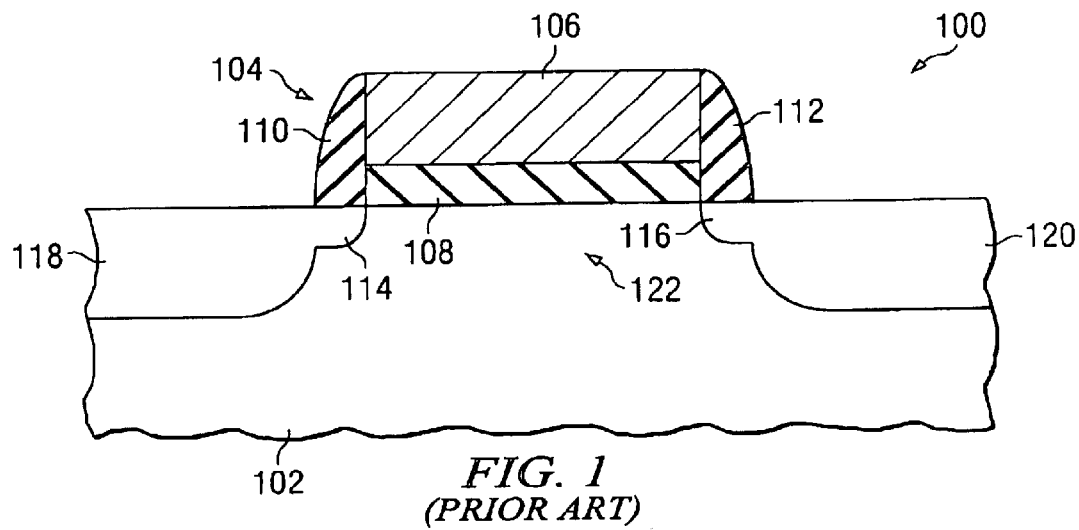
FIG. 1 is a simplified, schematic cross-sectional illustration of a conventional transistor.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The present invention pertains to formation of a transistor in a manner that mitigates short channel effects and junction capacitances, thereby facilitating enhanced switching speeds. More particularly, compensation regions are formed with dopants implanted relatively deeply over source and drain regions within a substrate. The compensation regions are spaced apart slightly more than the source and drain regions to alter potential contours and reduce capacitive contact areas, thereby reducing junction capacitances within the transistor. The different distances between the source and drain regions and the compensation regions are achieved by forming and selectively adjusting sidewall spacers adjacent to a gate structure of the transistor. These spacers serve as guides for the dopants implanted into the substrate to form the source and drain regions and the compensation regions.

In order to appreciate various aspects of the present invention, a brief description of a conventional MOS device and fabrication process follows below. FIG. 1 illustrates a conventional semiconductor transistor device 100 that can be fabricated with conventional complimentary MOS (CMOS) processing techniques in a semiconductor substrate 102. The device 100 includes a gate structure 104 comprising a gate electrode 106 and a gate dielectric 108. The gate electrode 106 generally comprises polysilicon or SiGe and overlies the gate dielectric 108. Sidewall spacers 110, 112 are located upon either side of the gate structure 104. As will be discussed further, the sidewall spacers 110, 112 impede doping of certain areas or extension regions 114, 116 underlying the spacers 110, 112. Two laterally spaced doped source/drain regions 118 and 120 are formed within the substrate 102 and a channel region 122 is defined therebetween under the gate structure 104.

In operation, the resistivity of the channel 122 may be controlled by a voltage applied to the gate electrode 106, where changing the gate voltage changes the amount of current flowing through the channel 122 between the source and drain. The gate contact or electrode 106 and the channel 122 are separated by the gate dielectric 108, which is an insulator and which opposes current flow between the gate electrode 106 and the channel 122, such that the device does not become activated until a sufficient voltage (at least larger than a threshold voltage Vt) is applied to the gate electrode 106.

Figure 2:
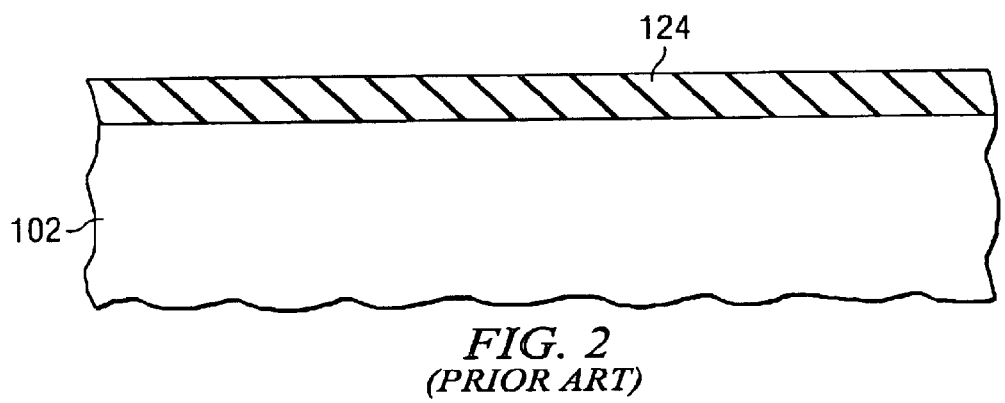
FIGS. 2–8 are cross-sectional illustrations depicting a conventional methodology for forming a PMOS transistor, such as that presented in FIG. 1.
Figure 3:
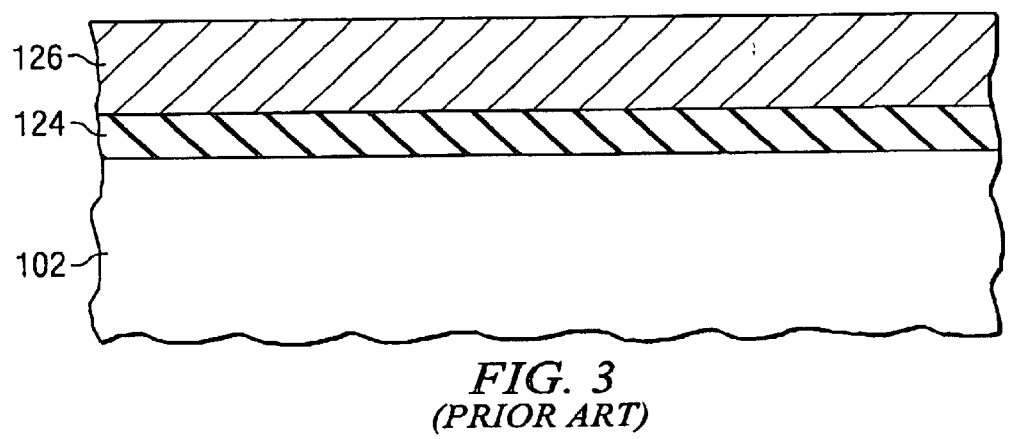
Figure 4:
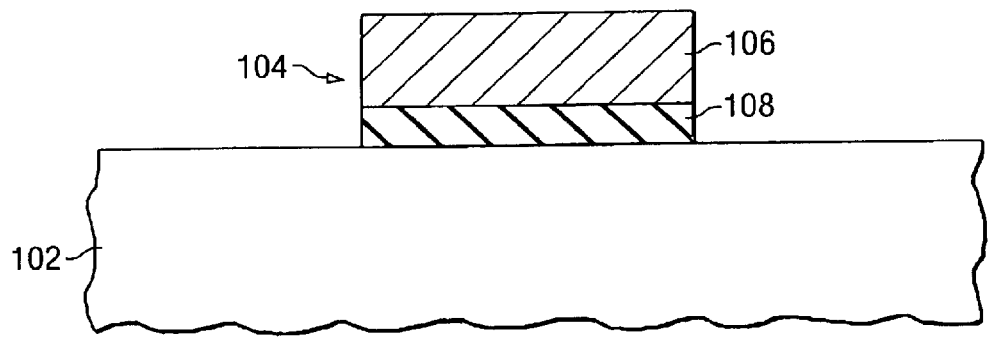
Figure 5:
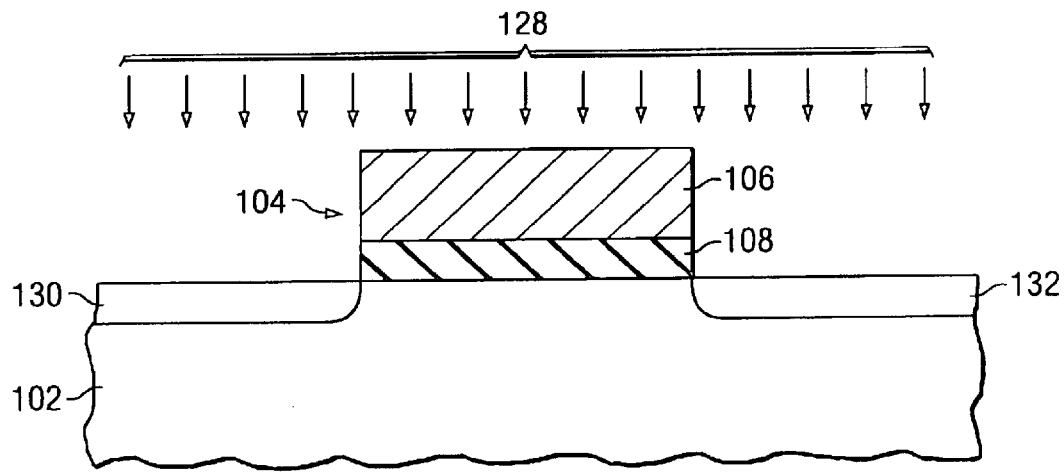

To form the device 100, a layer of dielectric material 124 is initially formed over the substrate 102 (FIG. 2). A gate electrode layer 126 (e.g., polysilicon or SiGe) is then formed over the layer of dielectric material 124 (FIG. 3). The gate electrode layer 126 and the layer of dielectric material 124 are then patterned (e.g., via etching) to develop the gate structure 104 (FIG. 4). Dopant 128 is then applied to the gate electrode 106 and to exposed portions of the substrate 102 to form extension regions 130, 132 therein (FIG. 5). As will become apparent, the extension regions 130, 132 are precursors to portions of the source and drain regions 118, 120 formed within the substrate 102.

Figure 6:
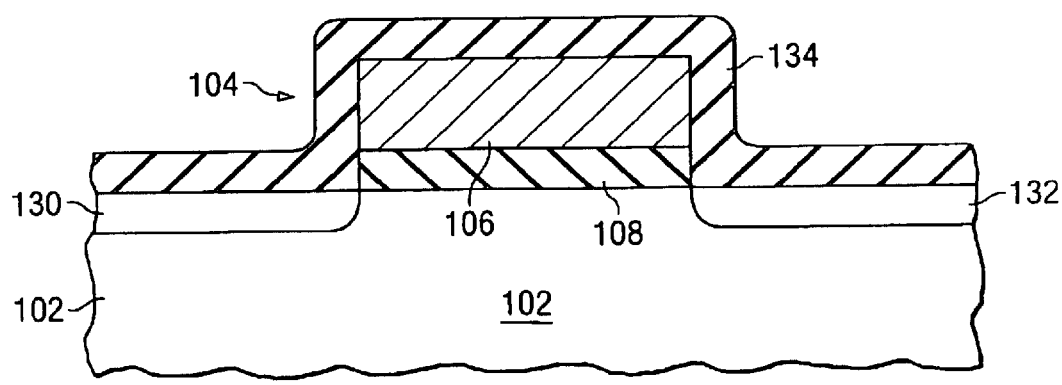
Figure 7:
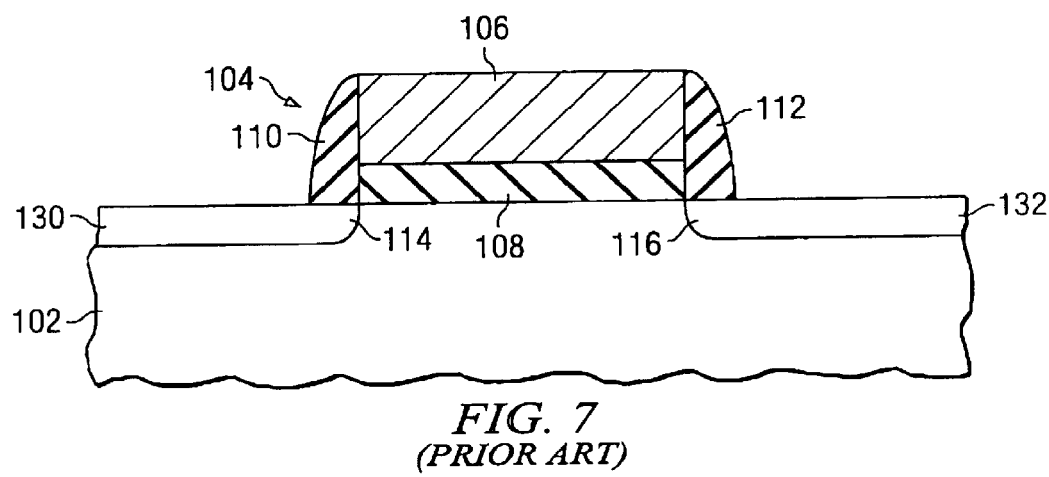
Figure 8:
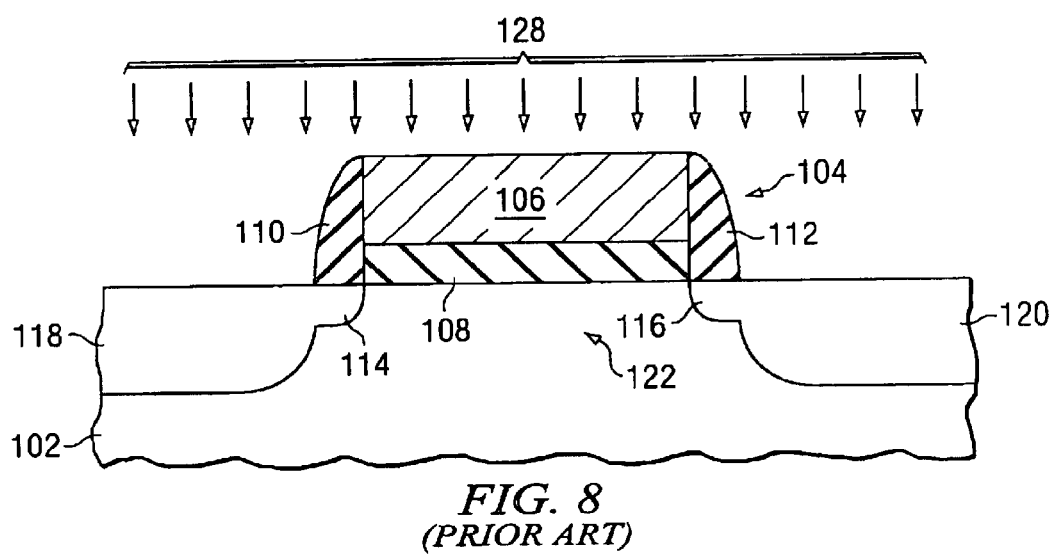

A layer of an insulating material 134 (e.g., silicon nitride, silicon oxide) is then formed over the entire structure (FIG. 6). The layer of insulating material 134 is selectively removed (e.g., via anisotropic etching) to form the sidewall spacers 110, 112 on either side of the gate structure 104 (FIG. 7). Additional dopant 128 is then applied to the gate electrode 106 and the substrate 102, except for those portions 114, 116 covered by the sidewall spacers 110, 112 (FIG. 8). The additional dopant 128 establishes the source and drain regions 118, 120 within the substrate 102 on either side of the gate structure 104. It will be appreciated that the additional dopant 128 is of substantially the same type as that previously applied in forming the extension regions 130, 132 (e.g., FIG. 5). The channel region 122 is thereby defined within the substrate 102 under the gate structure 104 as the source and drain regions 118, 120 are formed (FIG. 8).

Figure 9:
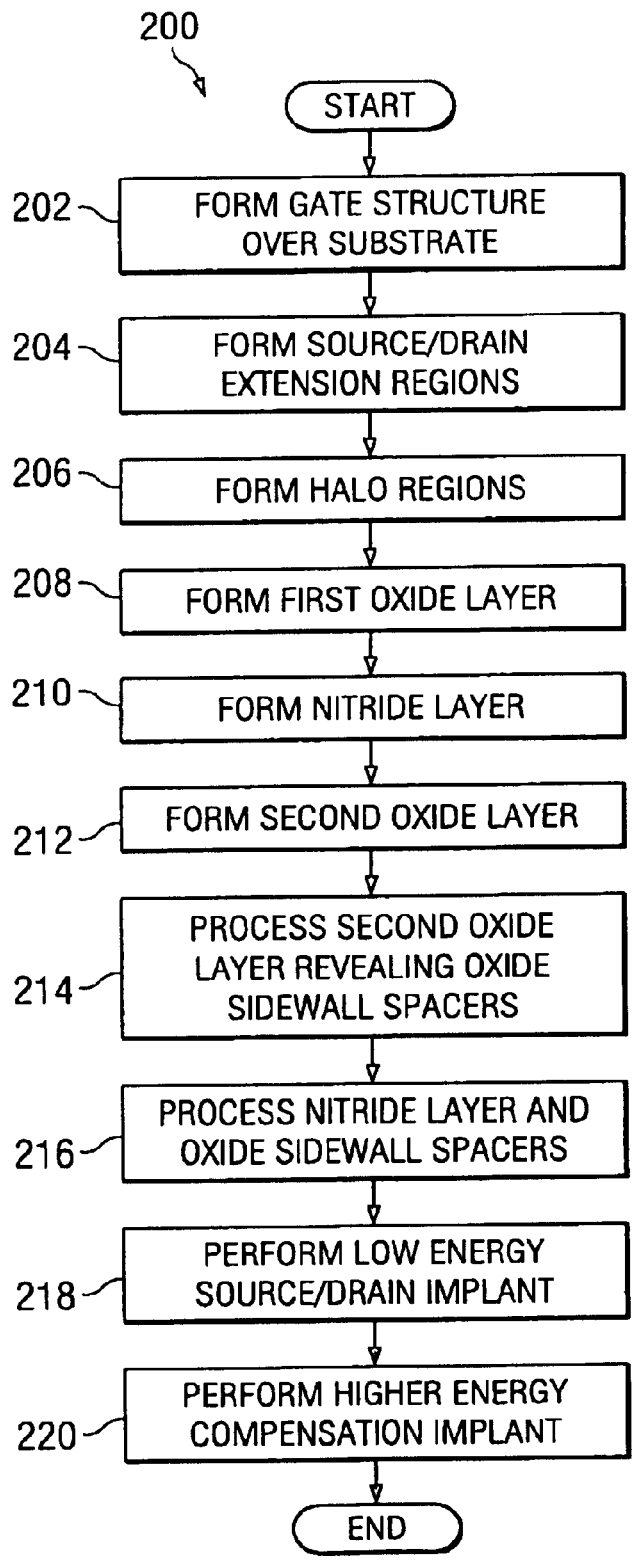
FIG. 9 is a flow diagram illustrating an example of a methodology of forming a transistor in accordance with one or more aspects of the present invention.

Turning now to FIG. 9, a methodology 200 is illustrated for forming a MOS transistor according to one or more aspects of the present invention. Although the methodology 200 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a transistor as illustrated and described below with respect to FIGS. 10–23, as well as to devices not shown or described with regard to FIGS. 10–23.

The methodology 200 begins at 202 wherein a gate structure is formed over a semiconductor substrate. In particular, a layer of gate dielectric material is formed over the semiconductor substrate, a gate electrode layer is formed over the layer of gate dielectric material, and the gate electrode layer and the layer of gate dielectric material are patterned to form the gate structure. The gate structure thus comprises a gate electrode and a gate dielectric. It will be appreciated that the layers can be patterned in any suitable manner to form the gate structure, such as by etching, for example.

Further, the layer of gate dielectric material and the gate electrode layer can be applied to the substrate in any number of ways, such as with spin-on techniques, sputtering techniques (e.g., magnetron or ion beam sputtering), growth and/or deposition techniques such as chemical vapor deposition (CVD), for example. The gate dielectric material can be formed to a thickness of about 1 nanometer or more, and can have an equivalent oxide thickness (EOT) of about 1 nanometer or less, for example, while the gate electrode layer can be formed to a thickness of about 50–200 nm, for example.

Additionally, the substrate generally includes silicon, the gate electrode layer generally includes doped polysilicon, SiGe or metal, and the layer of gate dielectric material can comprise a high-k dielectric material, for example. The layer of gate dielectric material may include, for example, any one or more of the following, either alone or in combination: aluminum oxide ($Al_2O_3$), zirconium silicate, hafnium silicate, hafnium silicon oxynitride, hafnium oxynitride, zirconium oxynitride, zirconium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate, barium strontium oxide, barium titanate, strontium titanate, $PbZrO_3$, PST, PZN, PZT and PMN.

The gate structure may also include a thin oxide over the polysilicon (e.g., about 1.5 nm thick) and a thin offset spacer (e.g., deposited and dry etched to a thickness of about 2–20 nm) on the sidewall thereof. Such an initial gate structure and other variations are contemplated as falling within the scope of the present invention.

After the gate structure is formed, the methodology proceeds to 204 wherein source/drain extension regions are formed. Such extension regions may, for example, be formed according to HDD (highly doped drain) techniques. The extension regions are generally formed within the substrate and facilitate absorption of some of the potential associated with the drain. In this manner, some of this potential is directed away from the drain/channel interface, thereby mitigating the occurrence of channel hot carriers and the adverse effects associated therewith. By way of example, a p-type dopant having a concentration of about 1E19 to 5E20 atoms/$cm^3$ for a PMOS transistor, or an n-type dopant having concentration of about 1E19 to 9.5E20 atoms/$cm^3$ for an NMOS transistor can be implanted to a depth of about 100–350 Angstroms, for example. It will be appreciated, however, that other implant concentrations and penetration depths are contemplated as falling within the scope of the present invention.

The methodology then proceeds to 206 wherein halo regions are formed within the semiconductor substrate. Halo implants (or pocket implants) can facilitate scaling the device channel length by creating localized dopant distributions near the source/drain (S/D) regions, where the distributions may extend, at least partially, under the channel. In this manner, halos can mitigate unwanted source/drain leakage conduction, or punchthrough current, and as such are sometimes referred to as "punchthrough stoppers". A quad high-angle implant may be utilized, for example, to place a halo dose around an edge of the gate structure in source/drain regions of the semiconductor substrate. In one example, such a high-angle implant can place a p-type halo dopant having a concentration of about 1 to 3E19 atoms/$cm^3$ at the center of the halos for an NMOS transistor. It will be appreciated, however, that other implant concentrations are contemplated as falling within the scope of the present invention.

Then, at 208 a first oxide layer is formed over the gate and exposed portions of the substrate. The first oxide layer can be formed to a thickness of about 20 to 120 Angstroms, for example. A nitride layer and a second oxide layer are then sequentially formed over the first oxide layer at 210 and 212, respectively. The nitride layer can be formed to a thickness of about 50 to 200 Angstroms and the second oxide layer can be formed to about 400 to 800 Angstroms, for example. It will be appreciated that the first oxide layer 208, nitride layer 210 and second oxide layer 212 can be formed in any number of suitable ways, such as with spin-on techniques, sputtering techniques (e.g., magnetron or ion beam sputtering), growth and/or deposition techniques such as chemical vapor deposition (CVD), for example.

At 214, the second oxide layer is processed (e.g., via dry etching, ion milling, or other suitable reduction techniques) to reveal oxide sidewall spacers adjacent to the gate. Such sidewall spacers can have a width of about 300 to 800 Angstroms, for example. At 216, some of the oxide material is processed to reduce the sidewall spacers and the nitride layer is processed to remove nitride material not covered/protected by the oxide sidewall spacers. It will be appreciated, however, that the processing of the nitride layer and the oxide sidewall spacers may be performed in separate acts, where nitride material is selectively removed and then oxide is subsequently selectively removed (e.g., via wet etching, CMP, other suitable reduction techniques), where the residual nitride material underlying the oxide sidewall spacers serves as a processing stopper. In one example, the second oxide layer on the nitride layer is partially removed, and in another example, the oxide material is completely removed.

At 218, source and drain implants are performed at relatively low energies. These implants are substantially blocked by the sidewall spacers and the residual nitride material as well as any residual second oxide material that may be residing there-over. Accordingly, the sidewall spacers and residual nitride material together act as a boundary that guides the dopants into source and drain regions of the substrate. By way of example, a dopant of Arsenic or other suitable substance having a peak concentration of about 0.5 to 5E20 atoms/cm$^3$ may be implanted at an energy level of about 20 to 50 KeV to provide dopant to an implant range into silicon of about 300–350 Angstroms, for example.

A compensation implant is then performed at 220 to place dopant deeper into the source and drain regions of the substrate. By way of example, a dopant of Phosphorous or other suitable substance having a peak concentration of about 5E17 to 5E19 atoms/cm$^3$ may be implanted at an energy level of about 30 to 40 KeV to provide dopant to an implant range into silicon of about 600–700 Angstroms. It will be appreciated that the compensation dopant penetrates deeper into the substrate as a result of the different (e.g., greater) mass of the compensation dopant relative to the dopant utilized for the source/drain implants at 218 and/or a different (e.g., greater) energy level utilized during the compensation implant. Regardless, the compensation dopant is generally implanted into the substrate to a depth about twice that of the source/drain implant at 218.

It will be appreciated that the subsequent selective oxide etching performed at 216 may result in a reduction in the oxide sidewall spacers such that they are not flush with remaining/underlying nitride material. In this manner, some of the remaining nitride material may overlie underlying substrate areas whereas the oxide spacers no longer cover these areas. The type of dopant and/or energy level utilized in the compensation implant facilitates passage of the compensation dopant through the nitride material, whereas the oxide portion of the spacers substantially block the compensation dopant (as well as the source/drain dopant implanted at 218). Accordingly, a portion of the dopant implanted into the source and drain regions during the compensation implant at 220 is implanted closer to the channel. Moving the deep source/drain junctions towards the channel in this fashion reduces gate sidewall junction capacitances by smoothing out the junctions, thus facilitating improved switching speeds, as will be further appreciated infra.

Figure 10:
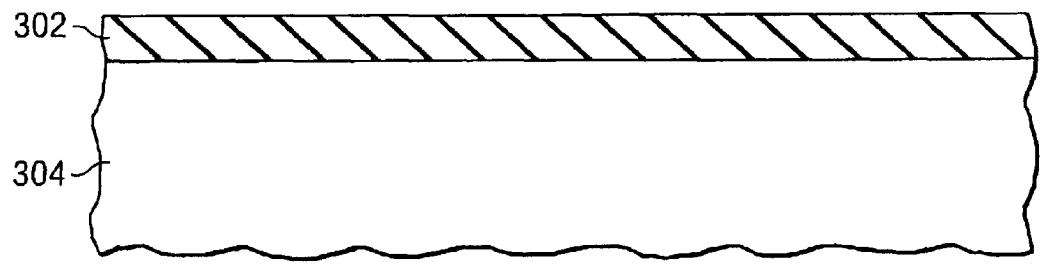
FIGS. 10–23 are cross-sectional illustrations of a transistor formed according to one or more aspects of the present invention.

Turning now to FIGS. 10–23, an exemplary technique for forming a transistor according to one or more aspects of the present invention is disclosed. Initially, a layer of gate dielectric material 302 is formed upon a semiconductor substrate 304 (FIG. 10). It is to be appreciated that the term "semiconductor substrate" as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

The layer of gate dielectric material 302 can include any of a number of suitable materials. Some examples include silicon dioxide, high-k materials, or a stack of such layers. It will be appreciated that the layer of gate dielectric material 302 can be formed across the substrate 304 in any of a number of suitable manners, including, for example, sputtering techniques (e.g., magnetron or ion beam sputtering), growth and/or deposition techniques, such as chemical vapor deposition (CVD). The layer of gate dielectric material can also be formed to a thickness of about 2.0 nanometers or more to mitigate "tunneling", and can have an equivalent oxide thickness (EOT) of about 2.0 nanometers or less, for example, so as to maintain and exhibit desired electrical properties. A dielectric material having a k of about 7.8 and a thickness of about 10 nm, for example, is substantially electrically equivalent to an oxide gate dielectric having a k of about 3.9 and a thickness of about 5 nm.

Figure 11:
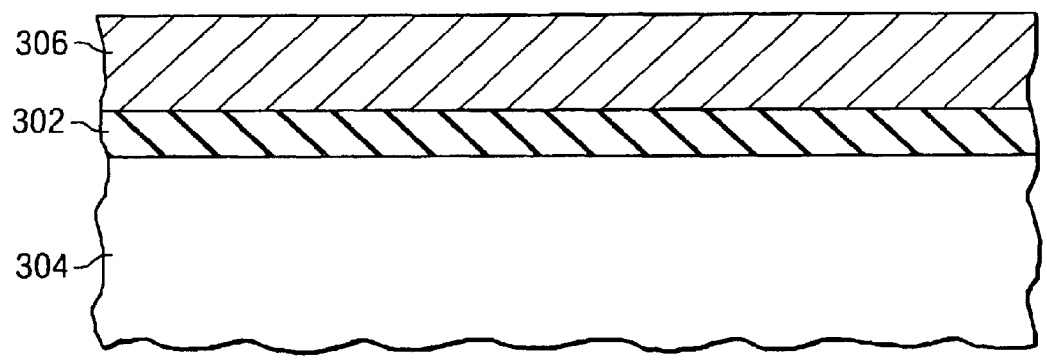

A gate electrode layer 306 is then formed over the layer of gate dielectric material 302 (e.g., via spin-on, sputtering, deposition, growth techniques, etc.) (FIG. 11). The gate electrode layer 306 generally includes doped polysilicon, SiGe or metal, and can be formed to a thickness of about 200 nanometers or less, for example. The gate electrode layer 306 ultimately yields a contact area or surface that provides a means for applying a voltage to the transistor 300 or otherwise biasing the transistor 300.

Figure 12:
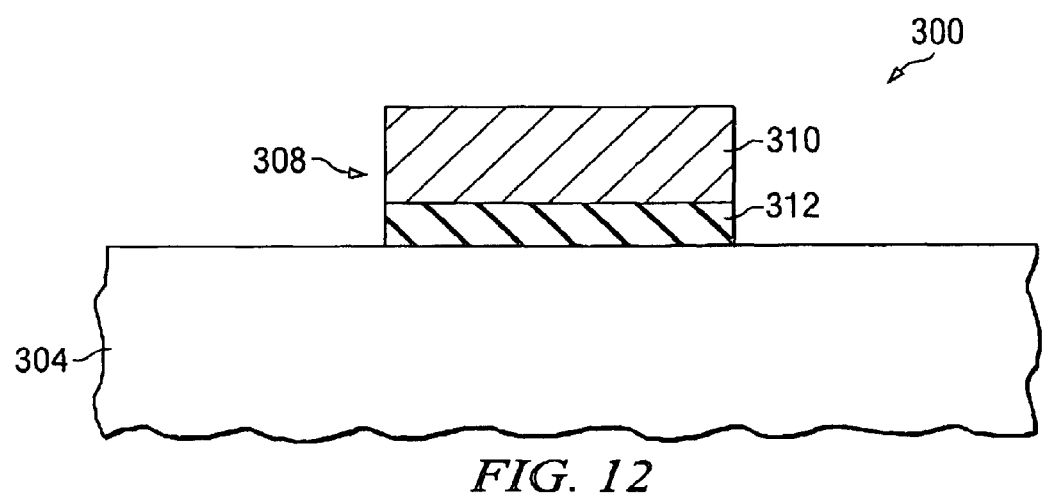

The gate electrode layer 306 and the layer of gate dielectric material 302 are then patterned to form a gate structure 308 (FIG. 12). The gate structure 308 thus comprises a gate electrode 310 and a gate dielectric 312. It will be appreciated that the layers can be patterned in any suitable manner(s), either alone or in combination, to form the gate structure 308, such as by etching.

Figure 13:
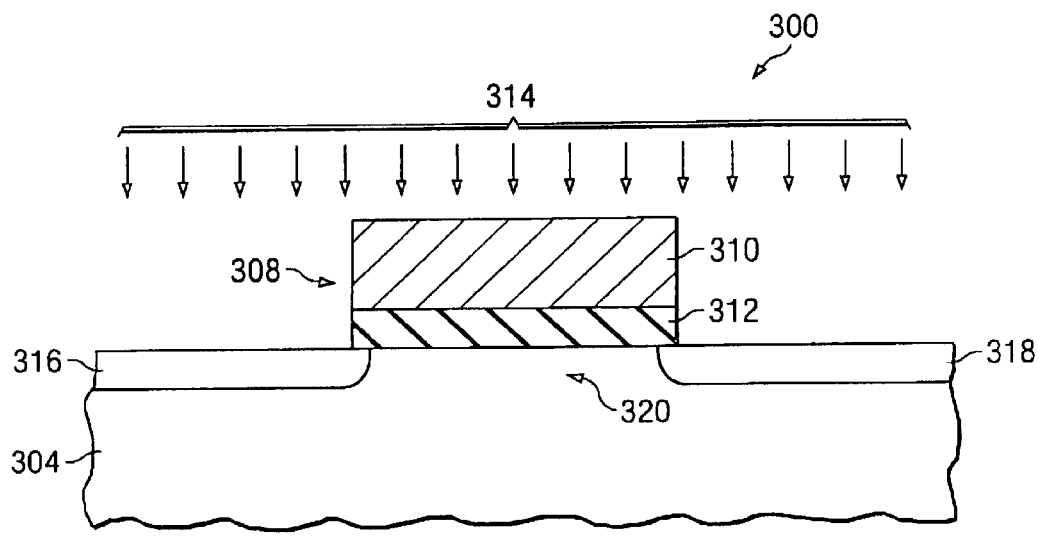

After the gate structure 308 is formed, a dopant 314 is applied to the substrate 304 to form source and drain extension regions 316, 318 therein (FIG. 13). Such extension regions may, for example, be formed according to HDD (highly doped drain) techniques. The extension regions abut a channel region 320 within the substrate 304 under the gate structure 308 and facilitate absorption of some of the potential associated with the drain. In this manner, some of this potential is directed, away from the drain/channel interface, thereby mitigating the occurrence of channel hot carriers and the adverse effects associated therewith. By way of example, a p-type dopant having a concentration of about 1E19 to 5E20 atoms/cm$^3$ for a PMOS transistor, or an n-type dopant having concentration of about 1E19 to 9.5E20 atoms/cm$^3$ for an NMOS transistor can be implanted to a depth of about 300–350 Angstroms, for example, to establish the extension regions 316, 318. It will be appreciated, however, that other implant concentrations and penetration depths are contemplated as falling within the scope of the present invention.

Figure 14:
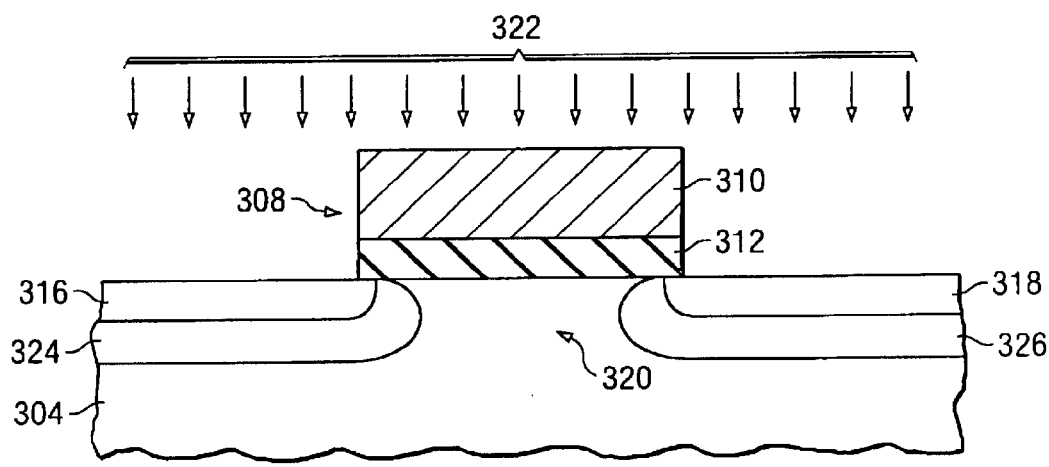

Another dopant 322 is then applied to the substrate 304 to form halo regions 324, 326 over the extension regions 316, 318 (FIG. 14). The halo implants (or pocket implants) can facilitate scaling channel length by creating localized dopant distributions near the source/drain (S/D) regions, where the distributions may extend, at least partially, under the channel. In this manner, halos can mitigate unwanted source/drain leakage conduction, or punchthrough current, and as such, are sometimes referred to as "punchthrough stoppers". A quad high-angle implant may be utilized, for example, to place a halo dose around an edge of the gate structure in source/drain regions of the semiconductor substrate. In one example, such a high-angle implant can place a halo dopant having a concentration of about 1 to 3E19 atoms/cm$^3$ at the center of the halos for an NMOS transistor. It will be appreciated, however, that other implant concentrations are contemplated as falling within the scope of the present invention.

Figure 15:
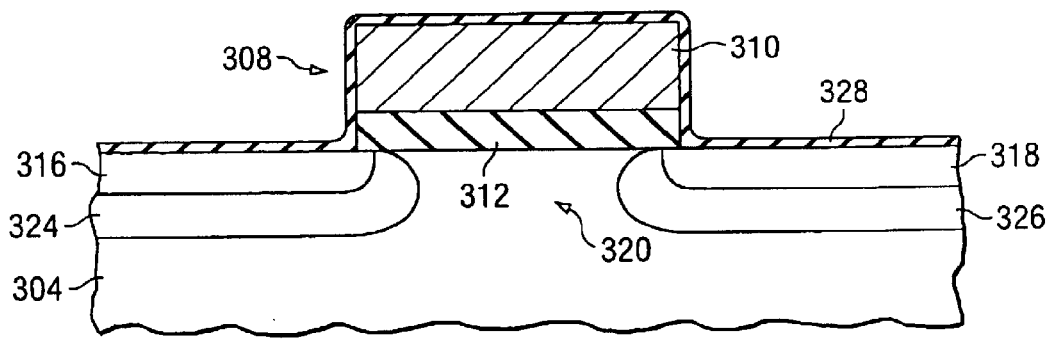
Figure 16:
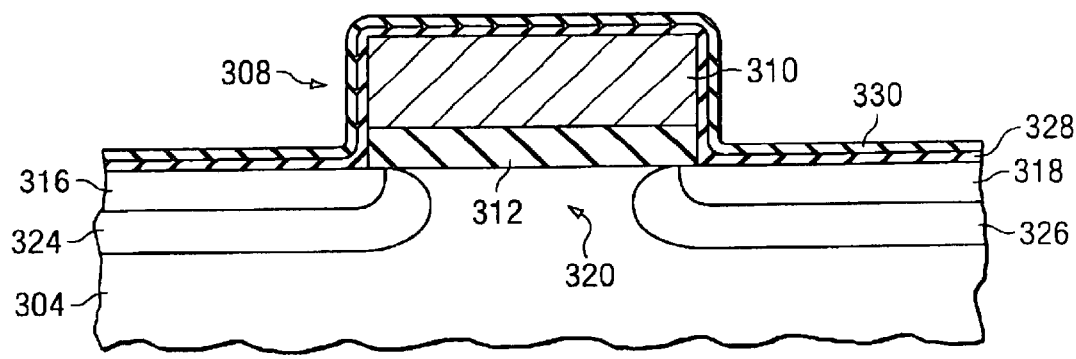
Figure 17:
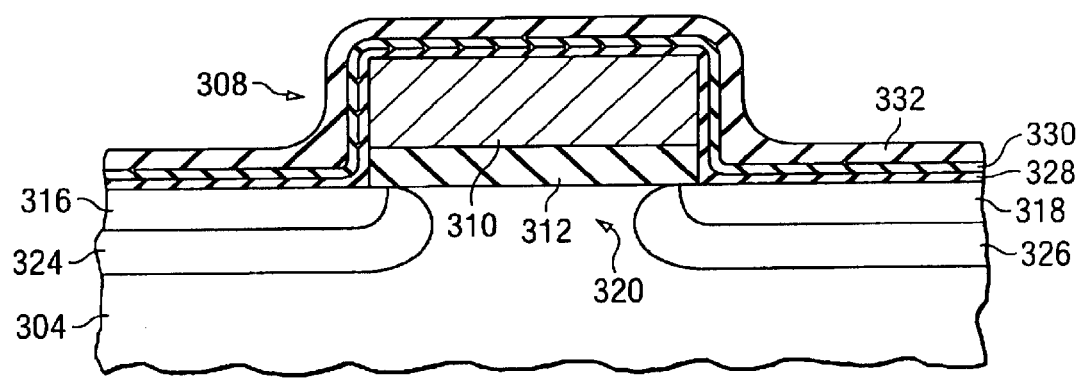

A first oxide layer 328 is then formed over the gate structure 308 and exposed portions of the substrate 304 (FIG. 15). The first oxide layer 328 can be formed to a thickness of about 20 to 120 Angstroms, for example. A nitride layer 330 is then formed over the first oxide layer 328 (FIG. 16), and a second oxide layer 332 is formed over the nitride layer 330 (FIG. 17). The nitride layer 330 can be formed to a thickness of about 50 to 200 Angstroms and the second oxide layer 332 can be formed to about 400 to 800 Angstroms, for example. It will be appreciated that the first oxide layer 328, nitride layer 330 and second oxide layer 332 can be formed in any number of suitable ways, such as with spin-on techniques, sputtering techniques (e.g., magnetron or ion beam sputtering), growth and/or deposition techniques such as chemical vapor deposition (CVD), for example. The layers 328, 330 and 332 are not drawn to scale in the figures, but instead are shown enlarged to help facilitate an understanding of one or more aspects of the present invention.

Figure 18:
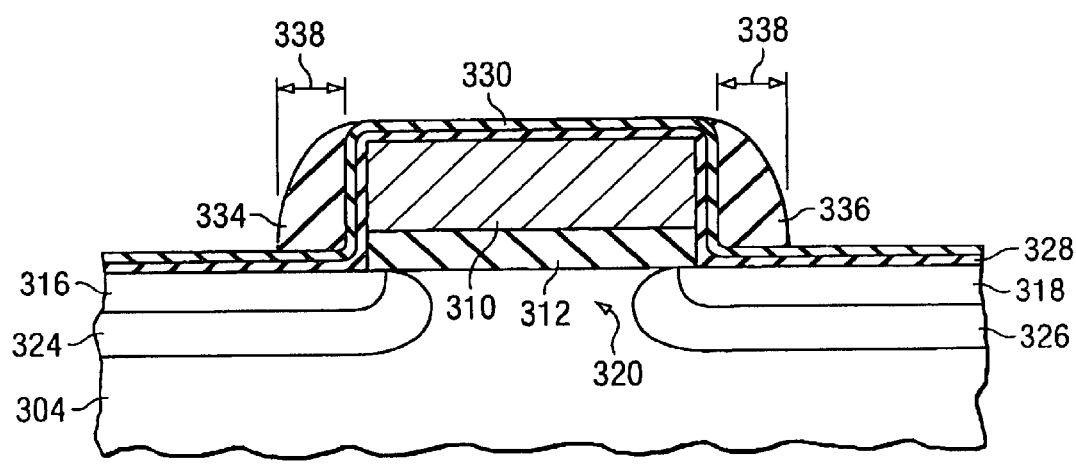

The second oxide layer 332 is then processed (e.g., via dry etching or other suitable reduction techniques) to reveal oxide sidewall spacers 334, 336 adjacent to the gate structure 308 (FIG. 18). Such sidewall spacers can have a width 338 of about 300 to 800 Angstroms, for example. It will be appreciated that this processing is selective such that the underlying nitride layer 330 is substantially unaffected by the processing.

Figure 19:
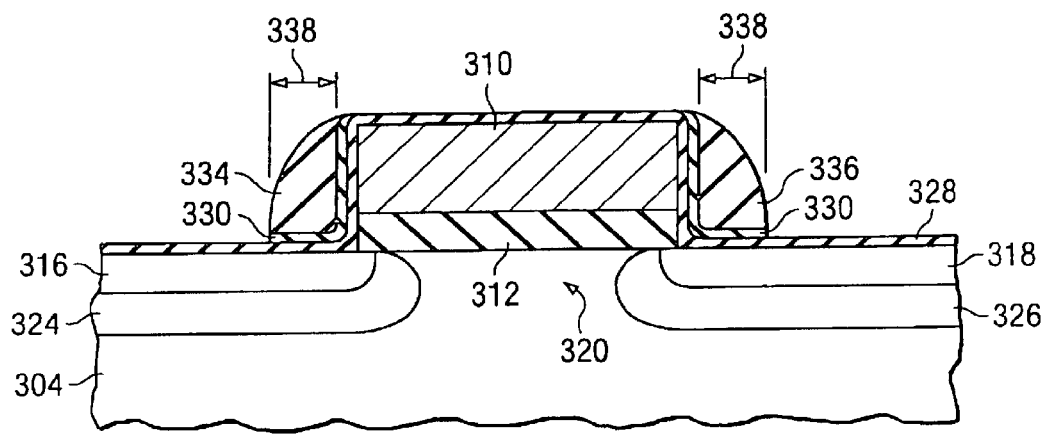

The nitride layer 330 is then processed (e.g., etched) to remove nitride material not covered/protected by the oxide sidewall spacers 334, 336 (FIG. 19). In the example shown the remaining or residual nitride material 330 has an "L" shape. It will be appreciated that this processing is also substantially selective such that the oxide sidewall spacers 334, 336 are not affected thereby. It will be further appreciated that any differences in the height and/or other dimension(s) of the oxide spacers 334, 336 depicted in the Figures is merely incidental and/or the result of intermediate acts that are generally understood, but that are not shown or described herein.

Alternatively, the "L" shaped region may comprise another material having a slower etch rate than oxide. For example, the layer may comprise polysilicon or other suitable material, and such alternatives are contemplated by the present invention. Similarly, the first oxide layer could be replaced with another suitable material in accordance with the present invention.

Figure 20:
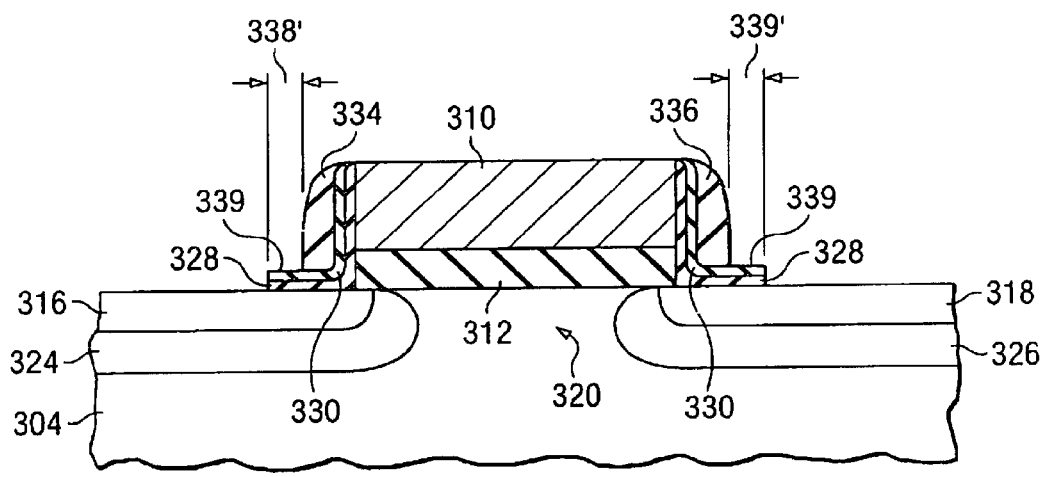

A portion of the remaining oxide material is subsequently processed (e.g., etched) to reduce the size of the sidewall spacers 334, 336 and to remove some or all of the exposed portions of the first oxide layer 328 (FIG. 20). The width 338 (FIGS. 18 and 19) of the sidewall spacers 334, 336 may, for example, be reduced to 338' (FIG. 20), where 338 is greater than 338'. Again, this processing is substantially selective such that the remaining (L shaped) nitride material 330 is not affected thereby. In this manner, portions of the first oxide layer 328 underlying the residual nitride material 330 are not affected by the processing. Moreover, the underlying L shaped nitride layer 330 can serve as a process (e.g., etch) stopper as the spacers are being processed. It will be appreciated that any differences in the height and/or other dimension(s) of the residual L shaped nitride material 330 depicted in the Figures is merely incidental and/or the result of intermediate acts that are generally understood, but that are not shown or described herein.

It will be appreciated that the oxide sidewall spacers 334, 336 and the nitride layer 330 are processed such that the sidewall spacers 334, 336 are reduced more than the nitride layer 330 (FIG. 20). In this manner, a portion 339 of the residual L shaped nitride material 330 having a width 339' overlies areas of the substrate 304 that are not covered by the oxide sidewall spacers 334, 336. This arrangement can be utilized to achieve certain doping profiles in the substrate 304 as will be described below.

Figure 21:
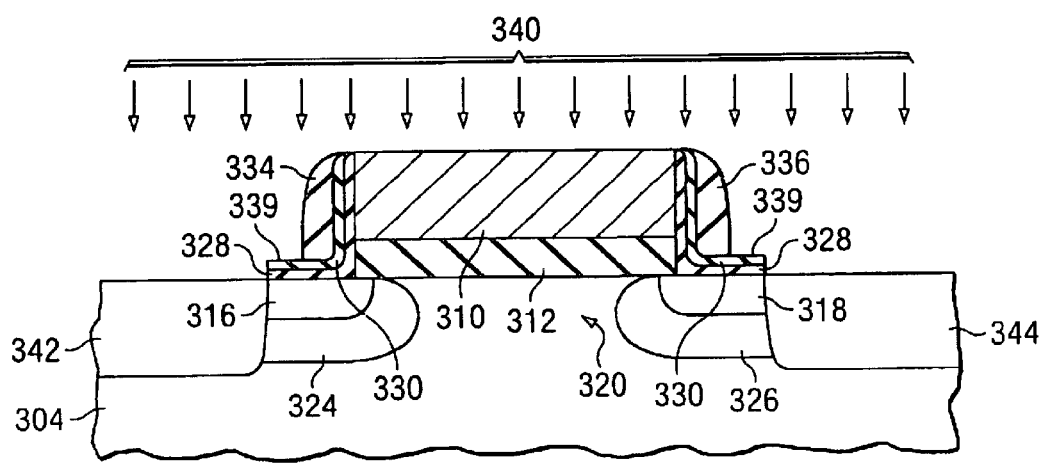

Additional, dopant 340 is then implanted in forming the source and drain regions 342, 344 (FIG. 21). These implants are done at relatively low energies and are substantially blocked by the sidewall spacers 334, 336 and the residual nitride material 330. Accordingly, the sidewall spacers 334, 336 and residual nitride material 330 together act as a boundary that guides the dopants 340 in forming the source and drain regions 342, 344 in the substrate 304. By way of example, a dopant of Arsenic or other suitable substance having a concentration of about 0.5 to 5E20 atoms/cm$^3$ may be implanted at an energy level of about 20 to 50 KeV to provide dopant to an implant range into silicon of about 300–350 Angstroms to form the source and drain regions 342, 344. It will be appreciated, however, that other implant concentrations, energy levels and/or penetration depths are contemplated as falling within the scope of the present invention.

Figure 22:
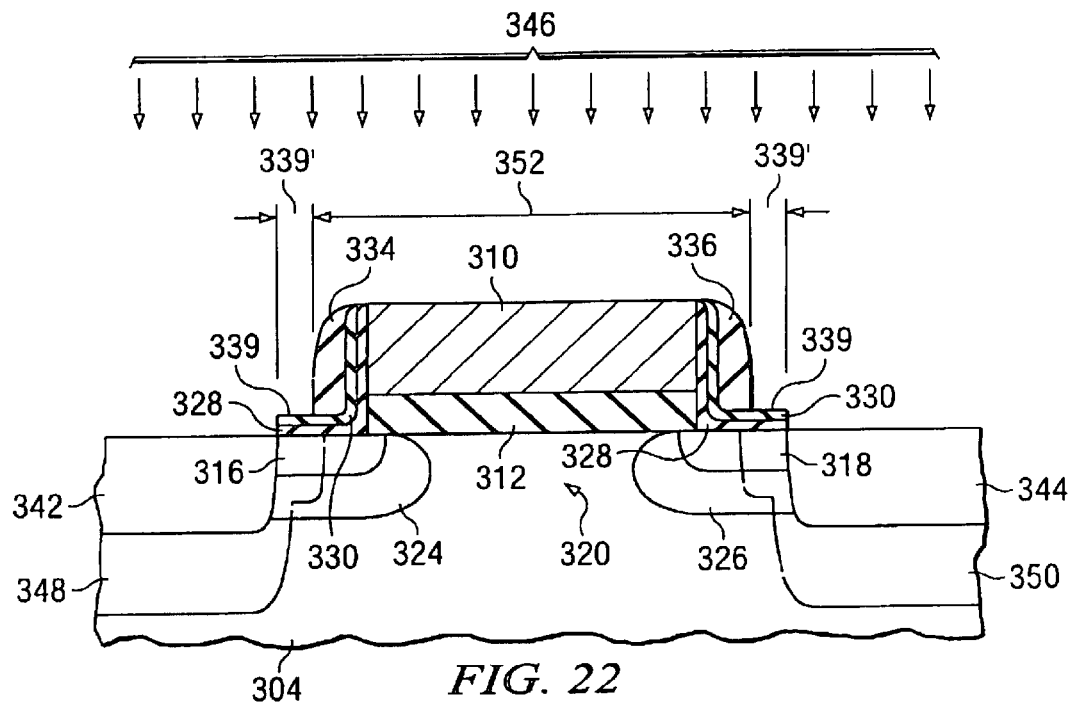

More dopant 346 is then implanted into the source and drain regions in the substrate 304 to form compensation regions 348, 350 (FIG. 22). The dopant 246 in the compensation regions 348, 350 are implanted relatively deeply into the substrate 304. By way of example, a dopant of Phosphorous or other suitable substance having a concentration of about 5E17 to 5E19 atoms/cm$^3$ may be implanted at an energy level of about 30 to 40 KeV to provide dopant to an implant range into silicon of about 600–700 Angstroms, for example. It will be appreciated that the compensation dopant 346 penetrates deeper into the substrate 304 as a result of the different (e.g., greater) mass and/or energy level of the compensation dopant 346 relative to the other dopants 314, 322, 340 utilized in doping the substrate 304. In general, the compensation dopant 346 is implanted into the substrate 304 to a depth about twice that of the dopant 340 utilized in establishing the source and drain regions 342, 344.

It will be appreciated that the selective oxide etching discussed above with respect to FIG. 20 leaves a portion 339 of the L shaped nitride material uncovered by the oxide sidewall spacers 334, 336. The dopant 346 and/or energy level utilized in the compensation implant (FIG. 22) facilitates passage of the compensation dopant through the nitride material 330, whereas the oxide spacers 334, 336 substantially block the compensation dopant 346, as well as the source/drain dopant 340 (FIG. 21). Accordingly, the compensation dopant 346 is implanted in the substrate closer to the channel 320 than the source/drain dopant 340. The separation between the deep compensation implants is thus smaller than it would be had the oxide sidewall spacers not been subsequently selectively processed (e.g., etched) to remove some of the oxide material and expose a portion 339 of the L shaped nitride layer. This is evident by a comparison of the distance 352 between the deep compensation implants 348, 350 where the sidewall spacers 334, 336 have been processed further (FIG. 22) and the distance 352' between the deep compensation implants 348, 350 in a situation where the sidewall spacers 334, 336 have not been subsequently processed (FIG. 23).

Figure 23:
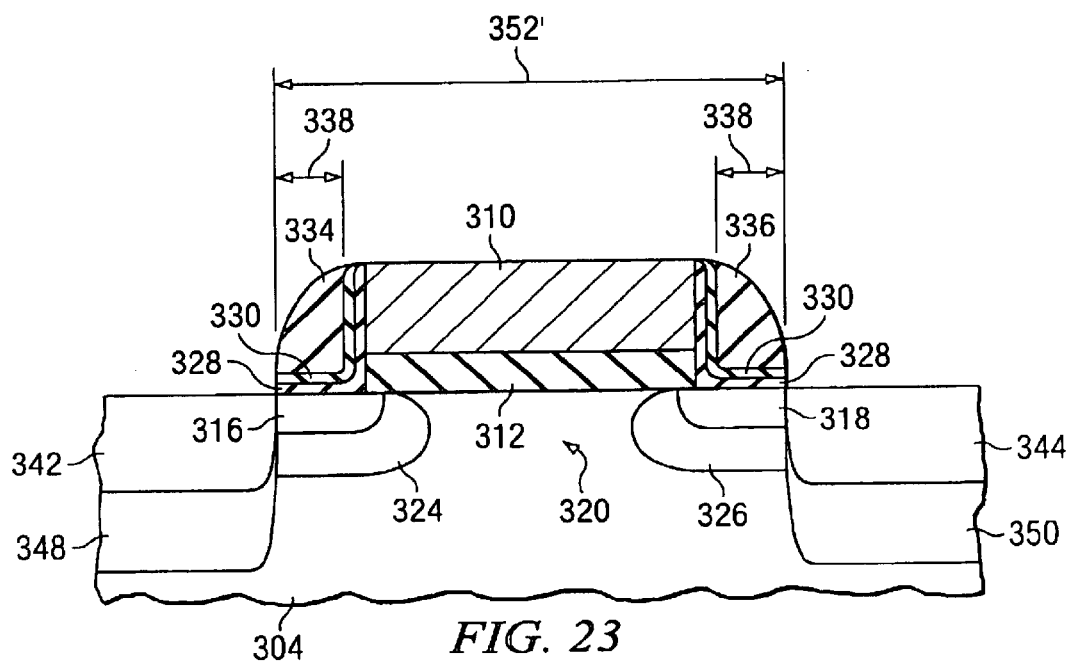

It can be seen in FIGS. 22 and 23 that 352' is greater than 352 by an amount equal to two times the width 339' of the portion 339 of the L shaped nitride layer 330 that is not covered by the oxide spacers 334, 336. Since the source/drain regions 342, 344 and the compensation regions 348, 350 are somewhat aligned FIG. 23, the distance 352' can also be said to correspond to the distance between the source 342 and drain 344 regions. Moving the deep junctions towards the channel 320 in the manner illustrated in FIG. 22 reduces junction areas where capacitance can arise. Reducing bottom wall areas in this fashion mitigates the opportunity for capacitive build up to occur, and thereby facilitates improved switching speeds.

Accordingly, it will be appreciated that one or more aspects of the present invention facilitate channel length scaling by altering short channel characteristics. By changing the doping profile in and around the channel region, the distribution of the dopants and potential contours can be changed to facilitate attaining higher switching speeds in a MOS transistor, at a higher drive current (Ids), but at a lower junction capacitance under the gate (Cjswg).

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming a transistor comprising:
   forming a first oxide layer over a gate structure and portions of a substrate not covered by the gate structure, where portions of the substrate not covered by the gate structure have source/drain extension regions and halo regions formed therein;
   forming a nitride layer over the first oxide layer;
   forming a second oxide layer over the nitride layer;
   processing the second oxide layer and nitride layer to form oxide sidewall spacers having a portion of nitride material there-under adjacent the gate structure;
   processing the oxide sidewall spacers such that they are reduced in size relative to the underlying portions of nitride material;
   doping regions of the substrate adjacent the gate structure with a first dopant to form source and drain regions within the substrate, the first dopant being substantially blocked by the oxide sidewall spacers and the underlying portions of nitride material; and
   doping regions of the substrate adjacent the gate structure with a second dopant to form first and second compensation regions within the substrate, the second dopant being substantially blocked by the oxide sidewall spacers.

2. The method of claim 1, wherein the source and drain regions are separated by a first distance, the first and second compensation regions are separated by a second distance and the first distance is greater than the second distance.

3. The method of claim 1, wherein the oxide sidewall spacers are processed according to at least one of wet etching and dry etching.

4. The method of claim 3, wherein the underlying portions of nitride material serve as etch stoppers as the oxide sidewall spacers are processed.

5. The method of claim 1, wherein the second oxide layer and nitride layer are processed via etching.

6. The method of claim 1, wherein extension regions are formed with a p-type dopant having a concentration of about 1E19 to 35E20 atoms/cm3 for a PMOS transistor, or an n-type dopant having concentration of about 7.51E19 to 9.5E20 atoms/cm3 for an NMOS transistor having a final junction depth of about 3100–350 Angstroms within the substrate.

7. The method of claim 1, wherein the halo regions are formed with a p-type dopant having a peak concentration of about 1 to 3E19 atoms/cm3 for an NMOS transistor.

8. The method of claim 1, wherein the first oxide layer is formed to a thickness of about 850 to 120 Angstroms.

9. The method of claim 1, wherein the nitride layer is formed to a thickness of about 1050 to 200 Angstroms.

10. The method of claim 1, wherein the second oxide layer is formed to a thickness of about 4300 to 6800 Angstroms.

11. The method of claim 1, wherein at least one of the first oxide layer, nitride layer and second oxide layer are formed according to at least one of spin-on techniques, sputtering techniques, growth techniques and deposition techniques.

12. The method of claim 1, wherein the source and drain regions are formed with a dopant of Arsenic.

13. The method of claim 12, wherein the source and drain regions are formed with a dopant having a concentration of about 0.55E19 to 2.5E185E20 atoms/cm3.

14. The method of claim 13, wherein the source and drain regions are formed with a dopant implanted at an energy level of about 20 to 50 KeV.

15. The method of claim 14, wherein the source and drain regions are formed with a doping profile peak to a depth of about 300–350 Angstroms.

16. The method of claim 12, wherein the compensation regions are formed with a dopant of Phosphorous.

17. The method of claim 16, wherein the compensation regions are formed with a dopant having a concentration of about 0.55E17 to 2.5E185E19 atoms/cm3.

18. The method of claim 17, wherein the compensation regions are formed with a dopant implanted at an energy level of about 30 to 40 KeV.

19. The method of claim 18, wherein the compensation regions are formed with a doping profile peak to a depth of about 600–700 Angstroms.

20. The method of claim 1, wherein the compensation regions extend inwardly toward a channel region underlying the gate structure an amount greater than that of the source and drain regions.

21. The method of claim 1, wherein the portions of nitride material underlying the oxide sidewall spacers are L shaped.

22. A method of forming a transistor comprising:
    forming source and drain regions within a substrate adjacent to a gate structure formed upon the substrate; and
    forming first and second compensation regions within the substrate, the source and drain regions and the first and second compensation regions being separated by a channel region underlying the gate structure, the source and drain regions being further separated by a first distance and the first and second compensation regions being separated by a second distance, the first distance being greater than the second distance.

23. The method of claim 22, wherein the source and drain regions are formed with a dopant of Arsenic having a concentration of about 0.55E19 to 2.5E185E20 atoms/cm3 implanted at an energy level of about 20 to 50 KeV to a depth of about 300–350 Angstroms.

24. The method of claim 23, wherein the compensation regions are formed with a dopant of Phosphorous having a concentration of about 0.55E17 to 2.5E185E19 atoms/cm3 implanted at an energy level of about 30 to 40 KeV to a depth of about 600–700 Angstroms.

25. The method of claim 22, wherein forming the source and drain regions and the first and second compensation region comprises:
    forming sidewall spacers on lateral edges of the gate structure;
    altering a structure of the sidewall spacers;
    doping the substrate region with a source/drain implant, wherein a dopant type or a dopant energy associated therewith is such that the altered sidewall spacer structure blocks the source/drain implant in a substrate region thereunder; and
    doping the substrate region with a compensation implant, wherein a dopant type or a dopant energy associated therewith is such that the altered sidewall spacer structure only partially blocks the compensation implant in the substrate region thereunder, thereby resulting in compensation regions extending toward a channel region within the substrate from the source and drain regions, respectively.

26. The method of claim 25, wherein forming sidewall spacers comprises:
    forming a first oxide layer over the gate structure;
    forming a nitride layer over the first oxide layer;
    forming a second oxide layer over the first oxide layer; and
    etching the second oxide layer and nitride layer in a generally anisotropic manner.

27. The method of claim 26, wherein altering the structure of the sidewall spacer comprises etching the second oxide layer, thereby reducing a size thereof.

28. A method of forming a transistor, comprising:
    forming a first spacer material layer over a gate structure and portions of a simiconductor body not covered by the gate structure, wherein portions of the semiconductor body not covered by the gate structure have source/drain extension regions and halo regions formed therein;
    forming a second spacer material layer over the first spacer material layer;
    forming a third spacer material layer over the second spacer material layer;
    processing the second and third spacer material layers to form sidewall spacers substantially adjacent the gate structure, and each having an "L" shaped portion of the second spacer material with the third spacer material residing thereover;
    processing the third spacer material overlying the "L" shaped second spacer material portions such that the third spacer material is reduced in size relative to the underlying portions of the second spacer material and exposing a portion of the "L" shaped second spacer material;
    doping regions of the semiconductor body adjacent the gate structure with a first dopant to form source and drain regions within the substrate, the first dopant being substantially blocked by the "L" shaped second spacer material; and
    doping regions of the semiconductor body adjacent the gate structure with a second dopant to form first and second compensation regions within the substrate, the second dopant being substantially blocked by the third spacer material, but not by the exposed portion of the "L" shaped second spacer material.

29. The method of claim 28, wherein the second spacer material comprises polysilicon and the third spacer comprises oxide.

30. The method of claim 29, wherein processing the second and third spacer material layers comprises etching, and wherein the oxide etches at a substantially faster rate than the polysilicon.

31. The method of claim 28, wherein the gate structure comprises a gate electrode material overlying a gate dielectric, wherein the gate electrode material has sidewalls associated therewith, and wherein offset spacer material resides on the sidewalls.

32. The method of claims 31, wherein the gate electrode material comprises polysilicon, silicon germanium or a metal.

* * * * *